(12) United States Patent
Kimura et al.

(10) Patent No.: US 8,115,141 B2
(45) Date of Patent: Feb. 14, 2012

(54) HEATING ELEMENT

(75) Inventors: Noboru Kimura, Gunma (JP);
Yoshihiro Kubota, Gunma (JP); Waichi Yamamura, Gunma (JP); Shoji Kano, Gunma (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 1193 days.

(21) Appl. No.: 11/783,580

(22) Filed: Apr. 10, 2007

(65) Prior Publication Data

US 2007/0241095 A1 Oct. 18, 2007

(30) Foreign Application Priority Data

Apr. 13, 2006 (JP) ................................. 2006-110696
Apr. 13, 2006 (JP) ................................. 2006-110700

(51) Int. Cl.
*F27D 11/00* (2006.01)
*C23C 16/00* (2006.01)

(52) U.S. Cl. ...................... 219/433; 219/444.1; 219/411; 219/390; 219/405; 118/724; 118/725; 118/50.1; 118/728; 118/729; 118/730

(58) Field of Classification Search .................. 219/433, 219/444.1, 444.2, 390, 405, 411; 118/724, 118/725, 50.1, 728–730
See application file for complete search history.

(56) References Cited

U.S. PATENT DOCUMENTS

| 5,343,022 | A | 8/1994 | Gilbert, Sr. et al. |
| 6,410,172 | B1 | 6/2002 | Gilbert, Sr. |
| 2003/0044653 | A1 | 3/2003 | Hiramatsu et al. |
| 2003/0234248 | A1 | 12/2003 | Kano et al. |

FOREIGN PATENT DOCUMENTS

| EP | 0 635 869 A1 | 1/1995 |
| EP | 1753014 | * 9/2005 |
| EP | 1 753 014 A1 | 2/2007 |
| EP | 1 764 829 A1 | 3/2007 |
| JP | A 5-109876 | 4/1993 |
| JP | A 5-129210 | 5/1993 |

(Continued)

OTHER PUBLICATIONS

"Vacuum", No. 12, vol. 33, pp. 53-54, 1990.

(Continued)

*Primary Examiner* — Shawntina Fuqua
(74) *Attorney, Agent, or Firm* — Oliff & Berridge, PLC

(57) ABSTRACT

There is disclosed a heating element 10 comprising: at least a heat-resistant base member 1; a conductive layer 3 having a heater pattern 3*a* formed on the heat-resistant base member; a protection layer 4 with an insulating property formed on the conductive layer; and a corrosion-resistant layer 4*p* having a nitrogen gas permeability of $1 \times 10^{-2}$ cm$^2$/sec or less or being made of a compound containing a dopant formed on the protection layer 4. There can be provided a heating element in which a corrosion-resistant layer whose nitrogen gas permeability, resistivity, or hardness are controlled is formed on a protection layer and through which the corrosive gas is difficult to be transmitted even under an environment of a high temperature and a corrosive gas and by which degradation due to corrosion of a conductive layer, particularly, a power-supply-terminal portion can be avoided and additionally which can fulfill a high function as an electrostatic chuck even when having a chuck pattern and which has a long operation life and is capable of being produced at a low cost.

60 Claims, 4 Drawing Sheets

FOREIGN PATENT DOCUMENTS

| | | |
|---|---|---|
| JP | A 6-061335 | 3/1994 |
| JP | A-08-264550 | 10/1996 |
| JP | A 11-354260 | 12/1999 |
| JP | A-2001-313330 | 11/2001 |
| JP | A-2002-033375 | 1/2002 |
| JP | A-2004-23024 | 1/2004 |
| JP | A-2004-363335 | 12/2004 |
| JP | A-2005-057214 | 3/2005 |
| WO | WO 01/38600 A1 | 5/2001 |
| WO | WO 2004/068541 A2 | 8/2004 |
| WO | WO 2006/005067 A2 | 1/2006 |

OTHER PUBLICATIONS

Sep. 23, 2010 Office Action issued in European Patent Application No. 07007534.6.

Office Action dated May 5, 2011 issued in Taiwanese Patent Application No. 096112817 (with translation).

Notification of Reasons for Refusal with Partial Translation: JP-A-2006-110700, dated Jun. 8, 2010.

Notification of Reasons for Refusal with Partial Translation; JP-A-2006-110696, dated Jun. 8, 2010.

* cited by examiner

HEATING ELEMENT

BACKGROUND OF THE INVENTION

1. Field of the Invention

The present invention relates to a heating element at least including, a heat-resistant base member, a conductive layer having a heater pattern formed on the heat-resistant base member, and a protection layer with an insulating property formed on the conductive layer.

2. Description of the Related Art

A heater in which a line or foil of metal having a high melting point such as molybdenum or tungsten is wrapped around or bonded to a heat-resistant base member made of sintered ceramic such as alumina, aluminum nitride or zirconia has been used for heating semiconductor wafers in manufacturing steps of semiconductor devices.

However, such a heater has drawbacks of being prone to deform or vaporize because the heating element is made of metal, being short-life, and being complicated to assemble (see, the pyrolytic graphite/pyrolytic boron nitride heater from Union Carbide Services provided in "Vacuum" No. 12, (33), p. 53). Furthermore, use of sintered ceramic for the heat-resistant base member causes a problem that the binder in the sintered ceramic becomes impurities.

Then, to prevent such deformation or scattering of impurities due to a heat cycle, a ceramic heater is developed. The ceramic heater has a heat-resistant base member of pyrolytic boron nitride (PBN) having high mechanical strength and enabling high-efficiency heating, and a conductive layer of pyrolytic graphite on the heat-resistant base member (for example, see the pyrolytic graphite/pyrolytic boron nitride heater from Union Carbide Services provided in "Vacuum" No. 12, (33), p. 53, U.S. Pat. No. 5,343,022; Japanese Patent Laid-open (Kokai) No. 05-129210; and Japanese Patent Laid-open (Kokai) No. 06-61335).

An example of a heating element of such a heater is shown in FIG. 4. A heating element 20 has at least a heating portion 20a in which a heater pattern 3a is formed on a plate-shaped heat-resistant base member 21, and a power-supply-terminal portion 20c in which power-supply terminals 3c are formed at the rim of the surface of the heat-resistant base member 21 on which the heater pattern is formed. A protection layer 4 with an insulating property is formed on the heater pattern 3a. To the power-supply terminal 3c, a power-supply member or a power terminal 5 is connected.

However, pyrolytic graphite used for the heating body is prone to undergo corrosion due to oxidation. Pyrolytic graphite has also reactivity with high-temperature gases used in the heating process. For example, hydrogen gas changes pyrolytic graphite into methane gas. Therefore, there is a problem that remaining oxygen or high-temperature gases in the process environment corrodes pyrolytic graphite in the power-supply-terminal portion exposed for power supply, and the power-supply-terminal portion is short life.

To solve the problem, an attempt to locate the power-supply-terminal portion away from the heating portion is made. For example, the following solution is suggested: a power-supply terminal is connected to a power-terminal member via a power-supply member having a heater pattern which produced heat by turning on electricity. Insulating ceramic such as PBN is used for a protection layer covering the heater pattern, thereby preventing overheating of the power-supply-terminal portion to increase longevity of the power-supply terminal (see, Japanese Patent Laid-open (Kokai) No. 11-354260).

Furthermore, the following method is suggested: assembling the power-supply-terminal portion made of carbon with an assembly part and forming a protection layer (see, U.S. Pat. No. 5,343,022; International Publication WO2004/068541).

However, such a heating element has protrusions on the heating surface. It is necessary to provide a space between the heating surface and an object to be heated, which hampers compact design of the heating element. In addition, a protection layer in the vicinity of a connected part assembled from plural components is apt to produce cracks through usage. A conductive layer begins to corrode from the cracks, which causes a problem to shorten the life of the heating element.

Furthermore, when the heating element is used in an environment corroding boride such as using a halide etching gas, there is a drawback that an outermost layer of boride lacks resistance to corrosion, and corrosion of the outermost layer shortens the life of the heating element.

Moreover, an advanced ceramic heater with electrostatic chuck on a heater for holding a semiconductor wafer serving as the object to be heated thereonto has been suggested currently (see, Japanese Patent Laid-open (Kokai) No. 05-129210; Japanese Patent Laid-open (Kokai) No. 06-61335; Japanese Patent Laid-open (Kokai) No. 05-109876). However, occasionally, chuck capability is not exerted sufficiently according to resistivity of the protection layer or the chucked wafer is damaged or cracked. Moreover, heat resistance and corrosion resistance of the heater is also insufficient in the same manner as described above.

SUMMARY OF THE INVENTION

The present invention has been accomplished to solve the above-mentioned problems, and an first object of the present invention is to provide a heating element through which the corrosive gas is difficult to be transmitted even under an environment of a high temperature and a corrosive gas and by which degradation due to corrosion of a conductive layer, particularly, a power-supply-terminal portion can be avoided and which has a long operation life and is capable of being produced at a low cost.

Moreover, a second object of the present invention is to provide a heating element which can fulfill a high function as an electrostatic chuck even when having a chuck pattern, which has a long operation life and is capable of being produced at a low cost.

To achieve the above object, the present invention provides a heating element comprising: at least a heat-resistant base member;

a conductive layer having a heater pattern formed on the heat-resistant base member;

a protection layer with an insulating property formed on the conductive layer; and a corrosion-resistant layer having a nitrogen gas permeability of $1 \times 10^{-2}$ cm$^2$/sec or less formed on the protection layer.

When the heating element has a corrosion-resistant layer having a nitrogen gas permeability of $1 \times 10^{-2}$ cm$^2$/sec or less formed on the protection layer as described above, the corrosion-resistant layer comes to have a low gas permeability, and it becomes difficult to transmit the corrosive gas even under an environment of a high temperature and a corrosive gas and degradation due to corrosion of a conductive layer, particularly, a power-supply-terminal portion can be avoided, and the heating element comes to have a long operation life.

In this case, it is preferable that a void ratio of the corrosion-resistant layer is 7% or less.

When a void ratio of the corrosion-resistant layer is 7% or less, the corrosive gas can be more effectively prevented from being transmitted.

Moreover, it is preferable that the corrosion-resistant layer is made of any one of aluminum, yttrium, and silicon, or a compound of any one of those.

When the corrosion-resistant layer is made of any one of aluminum, yttrium, and silicon, or a compound of any one of those as described above, the heating element can be stably used even under a corrosive environment such as a halide etching gas or oxygen.

As examples of such compounds, the corrosion-resistant layer can be made of any one of alumina, aluminum nitride, aluminum fluoride, yttria, yttrium nitride, yttrium fluoride, silicon oxide, and silicon nitride, or a combination of any two or more of those.

Moreover, the present invention provides a heating element comprising: at least a heat-resistant base member;

a conductive layer having a heater pattern formed on the heat-resistant base member;

a protection layer with an insulating property formed on the conductive layer; and a corrosion-resistant layer made of a compound containing a dopant formed on the protection layer.

When the heating element has a corrosion-resistant layer made of a compound containing a dopant formed on the protection layer as described above, degradation due to corrosion of a conductive layer, particularly, a power-supply-terminal portion can be avoided even under an environment of a high temperature and a corrosive gas, and the heating element comes to have a long operation life.

Moreover, even when a corrosion-resistant layer is formed on the outermost layer in order to prevent a corrosive gas, generally, in the case in which a heating element is used as an electrostatic chuck, its resistivity is too high to exert chuck capability. However, when the heating element having a corrosion-resistant layer made of a compound containing a dopant is used as an electrostatic chuck, its resistivity and its hardness can be controlled and the corrosion-resistant layer can be set to have a low resistivity, and therefore, can exert a high chuck capability, and the chucked wafer can be prevented from being damaged or broken.

In this case, it is preferable that on an opposite surface to a surface of the heat-resistant base member on which the heater pattern is formed, an electrostatic chuck pattern for holding an object to be heated is formed, and on the electrostatic chuck pattern, the protection layer and the corrosion-resistant layer are formed.

When an electrostatic chuck pattern for holding an object to be heated is formed on an opposite surface to a surface of the heat-resistant base member on which the heater pattern is formed and the protection layer and the corrosion-resistant layer are formed on the electrostatic chuck pattern, the heating element can more effectively exert a high chuck capability and therefore, can hold and efficiently heat the object to be heated, and therewith a position thereof can be high-precisely set. In such a case in which precision of the position of the object to be heated is required as ion implantation, plasma etching, sputtering, and so forth, a desired heating process can be performed more accurately.

As examples for such a compound, it is preferable that said compound constituting the corrosion-resistant layer is any one of alumina, aluminum nitride, yttria, and yttrium fluoride, or a combination of those.

When said compound constituting the corrosion-resistant layer is any one of alumina, aluminum nitride, yttria, and yttrium fluoride, or a combination of those as described above, the heating element can be stably used even under a corrosive environment such as a halide etching gas or oxygen.

Moreover, it is preferable that the dopant is any one of boron, aluminum, gallium, carbon, silicon, titanium, germanium, zirconium, yttrium, scandium, and lanthanoid elements, or a combination of any two or more of those. Furthermore, it is preferable that a content of the dopant is 0.01%~30%.

When the above-described dopant is any one of such group 3 elements, group 4 elements, group 13 elements, group 14 elements, and rare-earth elements, or a combination of any two or more of those, and when a content thereof is set to be a small amount of 0.01%~30%, in the case in which an oxide ceramics such as yttria having a high corrosive resistance is used as the material under an environment of a high temperature and a corrosive gas, its resistivity and its hardness can be effectively controlled and the heating element can have a high chuck capability.

Furthermore, it is preferable that surface roughness Ra of an outermost surface of the corrosion-resistant layer is 1 μm or less.

When surface roughness Ra of an outermost surface of the corrosion-resistant layer is 1 μm or less as described above, the surface roughness of the outermost surface becomes sufficiently small, and therefore, a contact area between the corrosion-resistant layer and the object to be heated becomes larger, and the object to be heated can be adsorbed and held stably on the corrosion-resistant layer without being damaged.

Moreover, it is preferable that resistivity of an outermost surface of the corrosion-resistant layer is $10^8$~$10^{13}$ Ω·cm (room temperature).

When resistivity of an outermost surface of the corrosion-resistant layer is $10^8$~$10^{13}$ Ω·cm (room temperature) as described above, in the case of using the heating element as an electrostatic chuck, the heating element has a high chuck capability.

Furthermore, it is preferable that a Vickers hardness of an outermost surface of the corrosion-resistant layer is 1 GPa to 8 GPa.

When a Vickers hardness of an outermost surface of the corrosion-resistant layer is 1 GPa to 8 GPa as described above, the hardness of the outermost surface is sufficiently small, and therefore, the object to be heated is not damaged, and the wafer can be stably put or adsorbed on the corrosion-resistant layer.

Moreover, it is preferable that the corrosion-resistant layer is formed by any one of CVD method, reactive sputtering method, ion plating, spraying method, and sol-gel method, or a combined method of those.

When the corrosion-resistant layer is formed by any one of CVD method, reactive sputtering method, ion plating, spraying method, and sol-gel method, or a combined method of those as described above, the corrosion-resistant layer having a low gas permeability or a high corrosion resistance can be formed.

Furthermore, it is preferable that the corrosion-resistant layer is a layer having a thickness of 0.1 μm to 20 μm that is formed by any one of CVD method, reactive sputtering method, and ion plating.

Because the corrosion-resistant layer whose void ratio is low or the thin corrosion-resistant layer having a high corrosive resistance can be formed by any method of CVD method, reactive sputtering method, and ion plating as described above, when the corrosion-resistant layer is formed by any one of those methods so that the layer has a relatively thin thickness of 0.1 μm to 20 μm, the thin corrosion-resistant layer having a low gas permeability or a high corrosion resistance can be formed at a low cost.

Moreover, it is preferable that the corrosion-resistant layer is a layer having a thickness of 1 μm to 100 μm that is formed by spraying method or sol-gel method.

When the corrosion-resistant layer is formed so as to be a layer having a relatively thick thickness of 1 μm to 100 μm by spraying method or sol-gel method, the corrosion-resistant layer having a low gas permeability or a high corrosion resistance can be formed at a low cost.

Furthermore, it is preferable that the protection layer is made of any one of boron nitride, pyrolytic boron nitride, silicon nitride, CVD silicon nitride, aluminum nitride, and CVD aluminum nitride, or a combination of any two or more of those.

When the protection layer is made of any one of boron nitride, pyrolytic boron nitride, silicon nitride, CVD silicon nitride, aluminum nitride, and CVD aluminum nitride, or a combination of any two or more of those as described above, the protection layer can set to be made of an insulating material that does not contain metal causing a short circuit, and thereby, the protection layer can protect the conductive layer by a high insulating property, and also have no delamination and no scattering of impurities in use at a high temperature, and can be used in a heating process in which a high purity is required, at a low cost.

Moreover, it is preferable that the conductive layer is made of pyrolytic carbon or grassy carbon.

When the conductive layer is made of pyrolytic carbon or grassy carbon, the conductive layer comes to be capable of being heated to a high temperature, and the conductive layer is easy to be processed and therefore the heater comes to make it easy that the heater pattern is set to have a meandering pattern and width, thickness, and so forth thereof are changed and thereby to make a discretionary temperature gradient therein or to make a heating distribution therein according to the heat environment to uniform the heat.

Furthermore, it is possible that the heat-resistant base member is a single piece comprising a plate portion on which a heater pattern is formed, a rod portion which projects from one surface of the plate portion and on which the current-carrying part is formed, an end portion which is located in an opposite end of the rod portion to the plate portion and on which a power-supply-terminal is formed;

a dielectric layer with an insulating property is formed on a surface of the heat-resistant base member;

the conductive layer is formed on the dielectric layer; and the protection layer is integrally formed so as to cover surfaces of the heater pattern and the current-carrying part.

When the heat-resistant base member is a single piece comprising a plate portion on which a heater pattern is formed, a rod portion which projects from one surface of the plate portion and on which the current-carrying part is formed, an end portion which is located in an opposite end of the rod portion to the plate portion and on which a power-supply terminal is formed, the heating portion in which the heater pattern is formed on the plate portion and the power-supply-terminal portion in which the power-supply terminal is formed in the end portion are separated by the conductive portion in which the current-carrying part is formed on the rod portion. Therefore, the power-supply-terminal portion comes to have a low temperature and becomes difficult to be worn away by a high-temperature gas in the process and the heating element has a long operation life.

Moreover, because the heat-resistant base member is a single piece and is not assembled by combining a plurality of components, the member is compact and is produced at a low cost, and additionally, the layer(s) formed on the heat-resistant base member become(s) difficult to be cracked by use and comes to have a long operation life.

Furthermore, in the conductive layer, as described above, the heater pattern, the current-carrying part, and the power-supply terminal are formed and therefore, surfaces of the heater pattern and the current-carrying part are covered with the protection layer and the corrosion-resistant layer, and the conductive layer is integrally formed. Therefore, the heating element is compact and is produced at a low cost and additionally the protection layer becomes difficult to be cracked by use and has a long-operation life.

In this case, it is preferable that the heat-resistant base member is made of graphite.

When the heat-resistant base member is made of graphite as described above, the material is inexpensive and easy to be processed even in a complex shape and therefore, the production cost can be lower and also its heat resistance is large.

Furthermore, it is preferable that the dielectric layer is made of any one of boron nitride, pyrolytic boron nitride, silicon nitride, CVD silicon nitride, aluminum nitride, and CVD aluminum nitride, or a combination of any two or more of those.

When the dielectric layer is made of any one of boron nitride, pyrolytic boron nitride, silicon nitride, CVD silicon nitride, aluminum nitride, and CVD aluminum nitride, or a combination of any two or more of those as described above, its insulating property is high and there is no scattering of impurities in use at a high temperature and the heating element can also be used in a heating process in which high purity is required.

Moreover, it is preferable that a length of the rod portion is 10~200 mm.

When a length of the rod portion is 10~200 mm, a sufficient distance between the terminal portion and the heating portion can be provided, and therefore, the terminal portion can have a sufficient low temperature, and the terminal portion can be more effectively prevented from being worn away.

Furthermore, it is preferable that the heater pattern is formed on the surface of that side of the plate portion from which the rod portion projects, and the electrostatic chuck pattern for holding an object to be heated is formed on the surface in the opposite side of the plate portion.

When the heater pattern is formed on the surface of that side of the plate portion from which the rod portion projects and, the electrostatic chuck pattern for holding an object to be heated is formed on the surface in the opposite side of the plate portion, an object to be heated can be held and heated and therefore, the heating can be efficiently performed and the position of the object to be heated can be set high-precisely, and in such a case in which precision of the position of the object to be heated is required as ion implantation, plasma etching, sputtering, and so forth, a desired heating process can be performed more accurately. Furthermore, the heating element has an advantage that degradation of the terminal portion can be also prevented as described above.

As described above, according to the present invention, there can be provided a heating element in which a corrosion-resistant layer whose nitrogen gas permeability, resistivity, or hardness is controlled is formed on a protection layer and through which the corrosive gas is difficult to be transmitted even under an environment of a high temperature and a corrosive gas and by which degradation due to corrosion of a conductive layer, particularly, a power-supply-terminal portion can be avoided and which has a long operation life and is produced at a low cost.

Moreover, in the case of using the heating element as an electrostatic chuck, its resistivity can be low and the heating element can exert a high chuck capability and additionally is difficult to damage the object to be heated.

Furthermore, when the heating portion and the power-supply-terminal portion are separated by the conductive portion in which the current-carrying part on the rod portion, the power-supply-terminal portion comes to have a low temperature and becomes difficult to be worn away by a high-temperature gas in the process and comes to have a long operation life.

DETAILED DESCRIPTION OF THE PREFERRED EMBODIMENTS

In the case in which a conventional heating element is used in an environment of corroding boride such as using a halide etching gas, there is a drawback that an outermost layer of boride lacks resistance to corrosion, and the heating element is corroded and comes to have a short operation life.

Moreover, according to research of the present inventors, even when a layer having a corrosion resistance is formed in the outermost layer, in the case in which the layer has a high gas permeability, occasionally, a corrosive gas has been transmitted and corrodes the lower layer(s) and shortens the operation life.

And, there has been a problem that even when a corrosion-resistant layer having a corrosion resistance is formed in the outermost layer, in the case in which the heating element is used as an electrostatic chuck, its resistivity is too high to exert the chuck capability.

Furthermore, there has been a problem that if hardness of the outermost surface on which an object to be heated such as a semiconductor wafer is put and chucked is too hard, the object to be heated is damaged and broken. Moreover, there has been a problem that if roughness of the outermost surface is too rough, the object to be heated is damaged or the contact area is too small to exert the chuck force.

Accordingly, the present inventors has thoroughly investigated and found that when a heating element comprises, a heat-resistant base member, a conductive layer having a heater pattern formed on the heat-resistant base member, a protection layer with an insulating property formed on the conductive layer, and a corrosion-resistant layer having a nitrogen gas permeability of $1\times10^{-2}$ cm$^2$/sec or less formed on the protection layer, the corrosive gas is not transmitted therethrough even under an environment of a high temperature and a corrosive gas and, degradation due to corrosion of a conductive layer or a terminal portion can be avoided and, the heating element has a long operation life and can be produced at a low cost. The present invention has been accomplished.

Furthermore, the present inventors has thoroughly investigated and found that when a heating element comprises, at least, a heat-resistant base member, a conductive layer having a heater pattern formed on the heat-resistant base member, a protection layer with an insulating property formed on the conductive layer, and a corrosion-resistant layer made of a compound containing a dopant formed on the protection layer, the corrosive gas is not transmitted therethrough even under an environment of a high temperature and a corrosive gas and, degradation due to corrosion of a conductive layer or a terminal portion can be avoided and, the heating element can have a high function as an electrostatic chuck and has a long operation life and can be produced at a low cost. The present invention has been accomplished.

Figure 1:
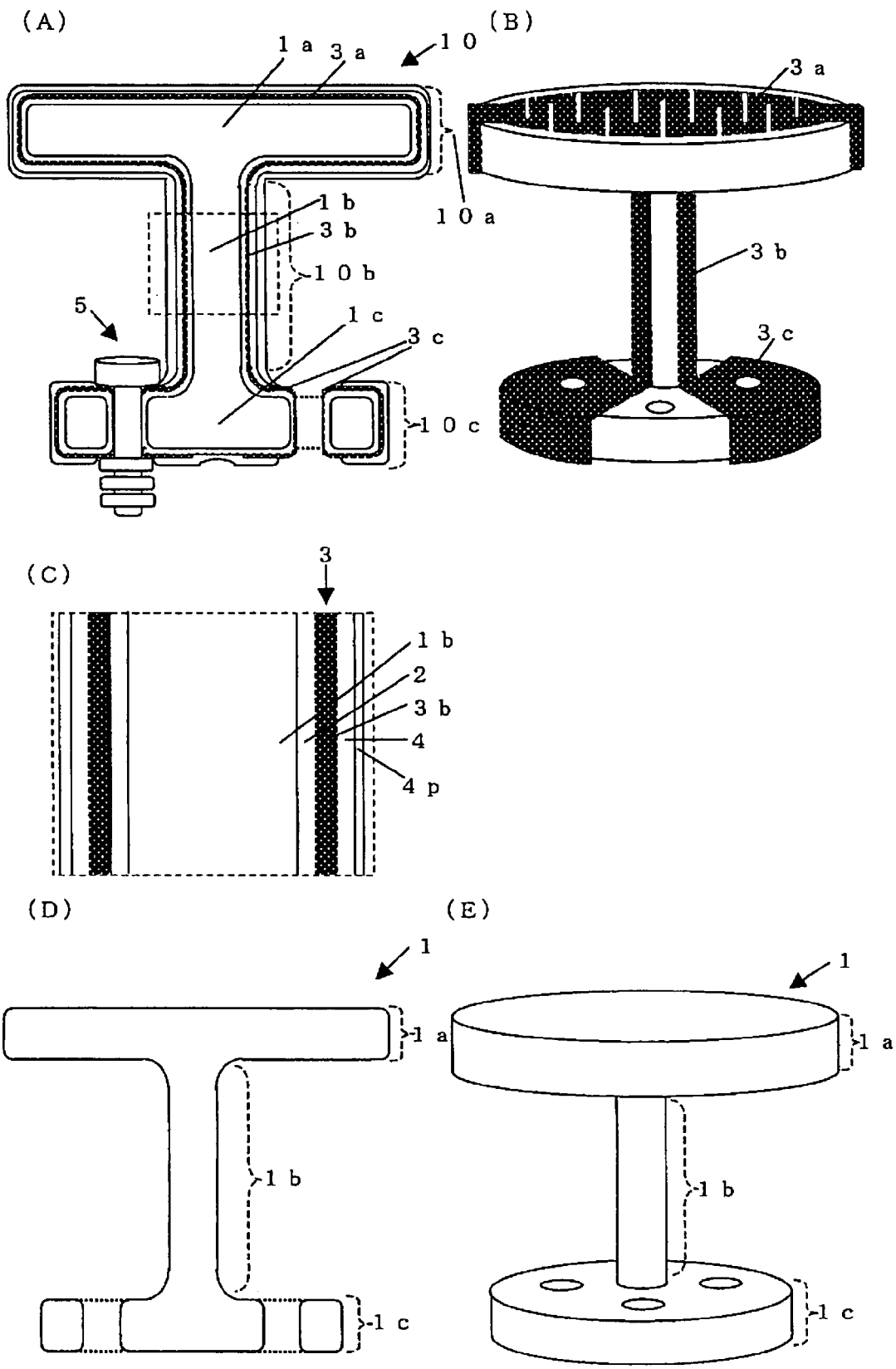
FIG. 1 is a schematic view showing an example (Example 1) of the heating element according to the present invention; (A) A section view of the heating element; (B) A perspective view showing the heating element from which the protection layer is removed; (C) An enlarged view of a partial section view (in the dot line portion of FIG. 1(A)) of the conductive portion of the heating element; (D) A section view of the heat-resistant base member; (E) A perspective view of the heat-resistant base member.
Figure 2:
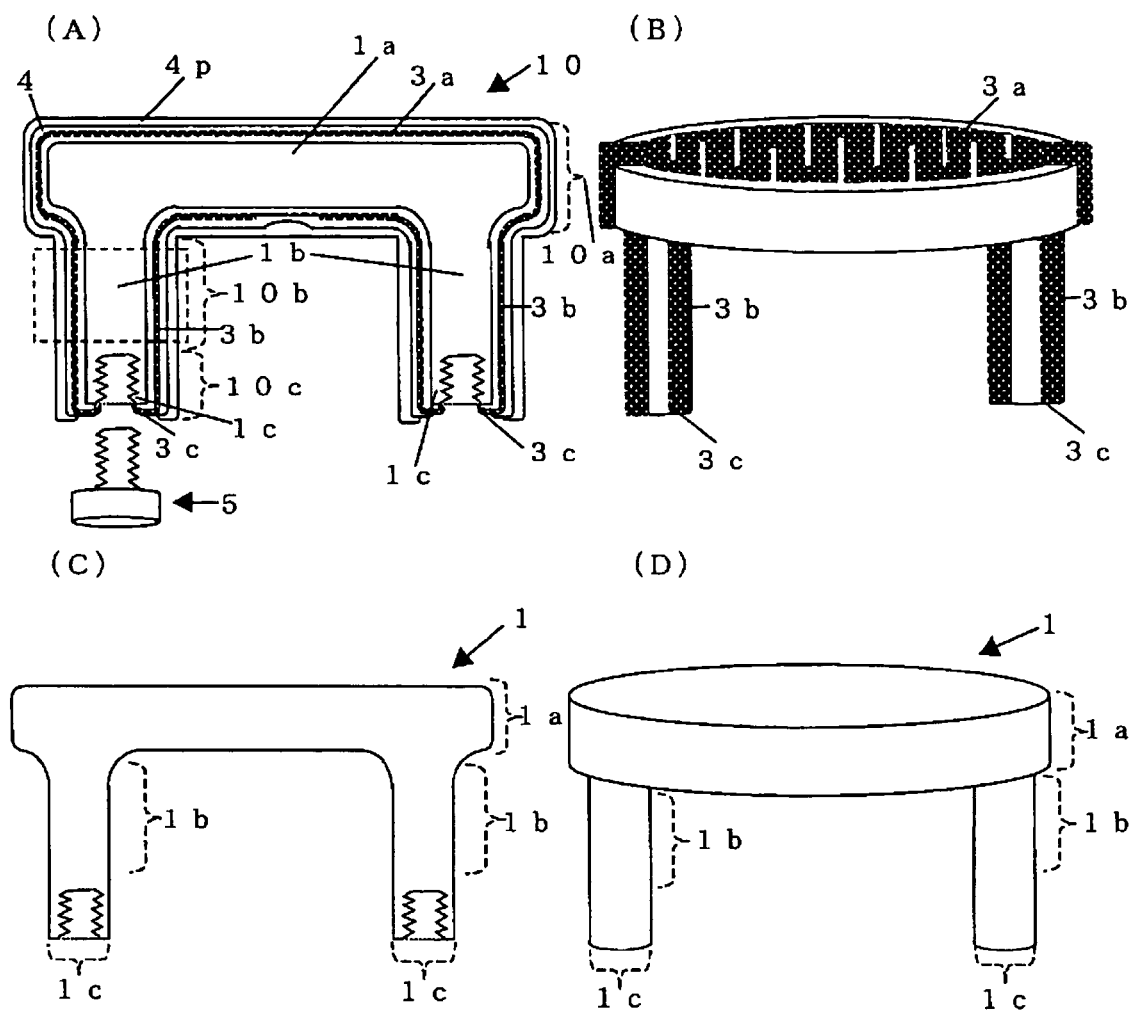
FIG. 2 is a schematic view showing another example (Example 2) of the heating element according to the present invention; (A) A section view of the heating element; (B) A perspective view showing the heating element from which the protection layer is removed; (C) A section view of the heat-resistant base member; (D) A perspective view of the heat-resistant base member.

Hereinafter, embodiments according to the present invention will be explained in detail with reference to drawings. However, the present invention is not limited thereto. FIGS. 1 and 2 are schematic views of the heating element of the present inventions.

A first embodiment according to the heating element 10 of the present invention comprises: at least a heat-resistant base member 1;

a conductive layer 3 having a heater pattern 3a formed on the heat-resistant base member;

a protection layer 4 with an insulating property formed on the conductive layer; and a corrosion-resistant layer 4p having a nitrogen gas permeability of $1\times10^{-2}$ cm$^2$/sec or less formed on the protection layer 4.

Thereby, it becomes difficult to transmit the corrosive gas even under an environment of a high temperature and a corrosive gas, and corrosion of the conductive layer 3 can be certainly prevented, and therefore, degradation due to corrosion of a conductive layer, particularly, a terminal portion can be avoided.

Figure 5:
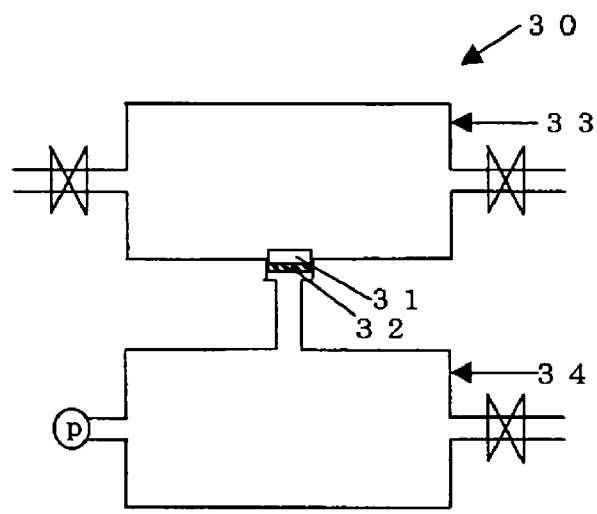
FIG. 5 is an explanatory view showing a measurement apparatus for measure the gas permeability.

Here, the nitrogen gas permeability is measured by using such a measurement apparatus 30 as shown in FIG. 5. First, a graphite plate 31 on which a layer 32 to be the same sample to be measured as the corrosion-resistant layer is formed is placed in such a measurement apparatus 30 being capable of vacuuming as shown in FIG. 5. Then, a predetermined amount of nitrogen is introduced in a container 33 in the side of the graphite plate, and pressure change in a container 34 in the side of the sample is measured and thereby, the nitrogen gas permeability is measured. As the graphite plate, for example, one having a diameter of 50 mm and a thickness of 10 mm can be used.

The gas permeability K ($cm^2$/sec) is represented by K=QL/($\Delta p \times A$). Here, Q (atm·$cm^3$/sec) is a gas transmission amount and represented by Q=($P_1-P_2$)×$V_0$/t. L (cm) is a thickness of the sample. $\Delta p$ (atm) is an initially set pressure difference and represented by $\Delta p = p_0 - p_1$. A ($cm^2$) is a transmission area.

In Q=($P_1-P_2$)×$V_0$/t, $P_1$ (atm) is initial inner pressure in the container 34 in the side of the sample, and $P_2$ (atm) is inner pressure in the container 34 in the side of the sample after transmission of the gas; $V_0$ ($cm^3$) is an inside volume of the container 34 in the side of the sample; t (sec) is transmission time.

In $\Delta p = p_0 - p_1$, $p_0$ (atm) is pressure in the container 33 in the side of the graphite plate.

Moreover, it is preferable that a void ratio of the corrosion-resistant layer 4p is 7% or less. Thereby, the corrosive gas can be more effectively prevented from being transmitted.

The void ratio in the corrosion-resistant layer 4p is a percentage of void that is not occupied by a constituent of the corrosion-resistant layer 4p. The void ratio can be measured by measuring weight increase by film formation and measuring the void and the thickness by microscopic observation.

Moreover, material of the corrosion-resistant layer 4p is sufficient as long as having a gas non-permeability and a heat resistance. However, it is preferable that the corrosion-resistant layer is made of any one of aluminum, yttrium, and silicon, or a compound of any one of those. Thereby, the heating element can be stably used even under a corrosive environment such as a halide etching gas or oxygen. That is, it is possible to use an aluminum or yttrium metal, or as examples of the compound of any one of aluminum, yttrium, and silicon, there may be used any one of alumina, aluminum nitride, aluminum fluoride, yttria, yttrium nitride, yttrium fluoride, silicon oxide, and silicon nitride, or a combination of any two or more of those, and multiple materials of any one or more of those may be used.

A second embodiment according to the heating element 10 of the present invention comprises: at least a heat-resistant base member 1;

a conductive layer 3 having a heater pattern 3a formed on the heat-resistant base member;

a protection layer 4 with an insulating property formed on the conductive layer; and a corrosion-resistant layer 4p made of a compound containing a dopant formed on the protection layer.

When the heating element has a corrosion-resistant layer 4p made of a compound containing a dopant formed on the protection layer 4 that is formed on the conductive layer having the heater pattern 3a as described above, the resistivity and the hardness are controlled and degradation due to corrosion of a conductive layer, particularly, a power-supply-terminal portion can be avoided even under an environment of a high temperature and a corrosive gas, and the heating element comes to have a long operation life.

Moreover, conventionally when the outermost surface layer is boride, there is a drawback that the outermost surface layer is corroded and comes to have a short operation life because its corrosion resistance is poor, and therefore, a corrosive layer is formed in the outermost layer. However, there has been a problem that in the case in which the heating element is used as an electrostatic chuck, resistivity of oxide ceramics such as yttria coated as the corrosion-resistant layer is too high to exert the chuck capability.

However, as described above, in the case in which the heating element having the corrosion-resistant layer 4p in which the above-described dopant is contained is used as an electrostatic chuck, the resistivity can be controlled by adjusting the content of the dopant, and particularly, the resistivity can be lower than that of the case of the heating element without the doping, and the heating element can exert a high chuck capability.

Furthermore, as shown in FIG. 3(A)(C), it is preferable that on an opposite surface to a surface of the heat-resistant base member on which the heater pattern 3a is formed, an electrostatic chuck pattern 6 for holding an object to be heated is formed, and on the electrostatic chuck pattern 6, the protection layer 4 and the corrosion-resistant layer 4p are formed.

Thereby, the heating element can effectively exert a high chuck capability and therefore, can hold and efficiently heat the object to be heated, and therewith a position thereof can be high-precisely set. In such a case in which precision of the position of the object to be heated is required as ion implantation, plasma etching, sputtering, and so forth, a desired heating process can be performed more accurately.

The pattern shape of the electrostatic chuck includes, for example, comb-tooth shape, convolution shape, concentric circular shape, semicircular shape, lattice shape, wedgy shape, and so forth.

Moreover, material of the corrosion-resistant layer 4p is sufficient as long as having a heat resistance. However, it is preferable that said compound constituting the corrosion-resistant layer 4p is any one of alumina, aluminum nitride, yttria, and yttrium fluoride, or a combination of those. Thereby, the heating element can be stably used even under a corrosive environment such as a halide etching gas or oxygen. Moreover, the corrosion-resistant layer 4p is not limited to only one layer and made of a plurality of layers, and thereby the corrosive resistance can be more enhanced, and it is possible to set at least one layer in which the dopant is contained.

Moreover, it is preferable that the dopant is any one of boron, aluminum, gallium, carbon, silicon, titanium, germanium, zirconium, yttrium, scandium, and lanthanoid elements, namely, group 3 elements, group 4 elements, group 13 elements, group 14 elements, and rare-earth elements, or a combination of any two or more of those. Furthermore, it is preferable that a content of the dopant is a small amount of 0.01%~30%. Thereby, even in the case in which an oxide ceramics such as yttria having a high corrosive resistance is used as the material under an environment of a high temperature and a corrosive gas, its resistivity can be effectively controlled to be a desired value and the heating element can have a high chuck capability.

Furthermore, it is preferable that surface roughness Ra of an outermost surface of the corrosion-resistant layer 4p is 1 μm or less. Thereby, the surface roughness of the outermost surface becomes sufficiently small, and therefore, a contact area between the corrosion-resistant layer and the object to be heated becomes larger, and the object to be heated can be adsorbed and held stably on the corrosion-resistant layer without being damaged.

Moreover, it is preferable that resistivity of an outermost surface of the corrosion-resistant layer 4p is $10^8$~$10^{13}$ Ω·cm (room temperature). Thereby, in the case of using the heating element as an electrostatic chuck, the heating element has a high chuck capability.

Furthermore, it is preferable that a Vickers hardness of an outermost surface of the corrosion-resistant layer 4p is 1 GPa to 8 GPa. Thereby, the hardness of the outermost surface is sufficiently small and therefore, the object to be heated is not damaged and, the wafer can be stably put on the corrosion-resistant layer.

The surface roughness, the resistivity, and the hardness can be controlled by adjusting the doping amount of the dopant.

And, it is preferable that the corrosion-resistant layer 4p is formed by any one of CVD method, reactive sputtering method, ion plating, spraying method, and sol-gel method, or a combined method of those. Thereby, the corrosion-resistant layer having a high corrosion resistance can be formed.

For example, because the corrosion-resistant layer having a low void ratio or the thin corrosion-resistant layer having a high corrosive resistance can be formed by any method of CVD method, reactive sputtering method, and ion plating, the corrosion-resistant layer can be formed by any one of those methods so that the layer has a relatively thin thickness of 0.1 µm to 20 µm, and the thin corrosion-resistant layer having a low gas permeability or a high corrosion resistance can be formed at a low cost.

Also, when the corrosion-resistant layer is formed so as to be a layer having a relatively thick thickness of 1 µm to 100 µm by spraying method or sol-gel method, the corrosion-resistant layer having a low gas permeability or a high corrosion resistance can be formed at a low cost.

For example, in the case of forming an yttria layer by CVD method, a compound having an appropriate vapor pressure or an appropriate sublimation pressure may be used as the gas material. For example, an oxide film may be formed under an atmospheric air by carrying yttrium 2-ethylhexanoate, yttrium dipivaloylmethanate, and so forth, in argon, nitrogen, and so forth, and using an oxygen-hydrogen flame. Or, the substrate is heated to 500° C. and a sublimation gas may be blown thereto under an atmosphere containing oxygen.

And, for example, when an yttria layer is formed by sol-gel method, a uniform yttria layer can be obtained by applying an yttria-sol solution to the substrate and then drying it and then calcining it. The yttria-sol solution is not limited as long as a sol solution having a compound containing yttria and a known sol solution can be used. For example, there can be exemplified an yttria-sol solution obtained by solving a component containing a predetermined amount of yttrium in a solvent, furthermore adding water and an acid therein, setting the temperature to be constant, and preparing it. A specific example of the compound includes yttrium compounds such as, yttrium halides such as yttrium chloride, yttrium subhalide yttrium organic acid, yttrium alkoxide, and yttrium complex.

Here, by using such a measurement apparatus 30 as shown in FIG. 6 as described above, the result of one example is shown below in the case in which permeability of a layer formed by, for example, reactive sputtering method, CVD method, spraying method, or sol-gel method is measured and then the void ratio is measured by the measurement of weight increase and by the void measurement and the thickness measurement using microscopic observation.

The corrosion-resistant layer 4p is formed on the protection layer that is formed on the conductive layer having the heater pattern so that the nitrogen gas permeability becomes $1 \times 10^{-2}$ cm$^2$/sec or less by adjusting material, formation method, formation condition, thickness, or the like of the layer, or by laminating a plurality of layers as described above. Thereby, the heating element by which degradation due to corrosion of a conductive layer can be avoided even under an environment of a high temperature and a corrosive gas and which has a long operation life and can be produced at a low cost.

Furthermore, it is preferable that the protection layer 4 is made of any one of boron nitride, pyrolytic boron nitride, silicon nitride, CVD silicon nitride, aluminum nitride, and CVD aluminum nitride, or a combination of any two or more of those. When the protection layer is set to be made of such an insulating material that does not contain metal causing a short circuit, the protection layer can protect the conductive layer by a high insulating property, and also have no delamination and no scattering of impurities in use at a high temperature, and can be at a low cost used in a heating process in which a high purity is required.

It is preferable that the conductive layer 3 is made of pyrolytic carbon or grassy carbon because the conductive layer comes to be capable of being heated to a high temperature, and the conductive layer is easy to be processed and therefore the heater comes to make it easy that the heater pattern is set to have a meandering pattern or the like and width, thickness, and so forth thereof are changed and thereby to make a discretionary temperature gradient therein or to make a heating distribution therein according to the heat environment to uniform the heat. In particular, pyrolytic graphite is more preferable because the layer can be produced at a low cost. However, the layer may be made of another material as long as a material having a high heat-resistance that can generate heat by turning on electricity. The shape of the heater pattern is not limited to such a meandering pattern (zigzag pattern) as shown in FIG. 1 and, for example, a convolution pattern having a concentric circular shape is possible.

The heater pattern 3a is formed on the plate portion 1a between the dielectric layer 2 and the protection layer 4, and by generating heat by turning on electricity, sufficient heat is provided in order to heat an object to be heated. As shown in FIGS. 1 and 2, one pair of introduction portions of current that is connected to the current-carrying part 3b is possible, and

TABLE 1

| Formed Corrosion-resistant Layer | Only Graphite Plate (No formation of Layer) | Aluminum Nitride Layer by Reactive Sputtering Method (Corrosion-resistant Layer of Example 1) | Multiple Yttria Layer (Corrosion-resistant Layer of Example 2) | Yttria Layer by Spraying Method (Corrosion-resistant Layer of Example 3) | Yttria Layer by Sol-gel Method (Corrosion-resistant Layer of Comparative example 1) |
|---|---|---|---|---|---|
| Permeability (cm$^2$/sec) | $3 \times 10^{-1}$ (Graphite Plate) | $1 \times 10^{-5}$ | $1 \times 10^{-4}$ | $1 \times 10^{-2}$ | $2 \times 10^{-2}$ |
| Thickness (mm) | 10 (Graphite Plate) | 0.02 | 0.012 | 0.03 | 0.04 |
| Void Ratio (%) | 19 (Graphite Plate) | 2 | 7.2 | 7 | 10 | however, by setting this to be two pair or more, it becomes possible to control the heater independently by two zones or more.

It is preferable that as shown in FIG. 1(B) or FIG. 2(B), the heater pattern 3a is formed on the opposite surface of the plate portion 1a to the surface from which the rod portion 1b projects. However, according to purpose, as shown in FIG. 3(B)(D), the heater pattern may be formed on the surface of that side of the plate portion 1a from which the rod portion 1b projects, or may be formed on the both surfaces.

It is preferable that the heat-resistant base member 1 is a single piece comprising a plate portion 1a on which a heater pattern 3a is formed, a rod portion 1b which projects from one surface of the plate portion and on which the current-carrying part 3b is formed, an end portion 1c which is located in an opposite end of the rod portion to the plate portion 1a and on which a power-supply terminal 3c is formed;

a dielectric layer 2 with an insulating property is formed on a surface of the heat-resistant base member 1;

the conductive layer 3 is formed on the dielectric layer 2; and the protection layer 4 is integrally formed so as to cover surfaces of the heater pattern 3a and the current-carrying part 3b.

Because the heating portion 10a in which the heater pattern 3a is formed on the plate portion 1a and the power-supply-terminal portion 10c in which the power-supply terminal 3c is formed in the end portion 1c are separated by the rod portion 1b on which the current-carrying part 3b is formed, the power-supply terminal 3c exposed in the power-supply-terminal portion 10c comes to have a low temperature and becomes difficult to be worn away by a high-temperature gas in the process and the heating element has a long operation life.

Moreover, because the heat-resistant base member 1 is a single piece and is not assembled by combining a plurality of components, the member is compact and is produced at a low cost, and additionally, the layer(s) formed on the heat-resistant base member 1 become(s) difficult to be cracked by use and comes to have a long-operation life.

Furthermore, in the conductive layer 3, as described above, the heater pattern 3a, the current-carrying part 3b, and the power-supply terminal 3c are formed and therefore, surfaces of the heater pattern 3a and the current-carrying part 3b are covered with the protection layer 4, and the conductive layer is integrally formed. Therefore, the heating element is compact and is produced at a low cost and additionally the protection layer 4 becomes difficult to be cracked by use and has a long-operation life.

It is preferable that the heat-resistant base member 1 is made of graphite because the material is inexpensive and easy to be processed even in a complex shape and therefore, the production cost can be lower and also its heat resistance is large. However, another material such as sintered boron nitride is possible as long as having a heat resistance.

The plate portion 1a may be a heating portion 10a in which the dielectric layer 2, the heater pattern 3a, and the protection layer 4 are formed. The shape is not necessarily such a circular plate shape as shown in FIGS. 1 and 2 and may be a polygonal plate shape.

It is sufficient that the rod portion 1b projects from one surface of the plate portion 1a and can form the conductive portion 10b in which the dielectric layer 2, the current-carrying part 3b, the protection layer 4, and further thereon the corrosion-resistant layer 4p are formed as shown in FIG. 1(C). Its shape is not necessarily a circular column as shown in FIGS. 1 and 2, and may be a polygonal column. Moreover, the rod portion 1b may be one as shown in FIG. 1, may be two as shown in FIG. 2, or more. In the heating element in FIG. 2, the heater pattern 3a is formed on both surfaces of the plate portion 1a, and the heating element is made to turn on electricity and heated by the two rod portions 1b.

By setting a length of the rod portion 1b to be 10~200 mm, a sufficient distance between the terminal portion and the heating portion can be provided, and therefore, the terminal portion can have a sufficient low temperature, and the terminal portion can be more effectively prevented from being worn away.

It is preferable that the dielectric layer 2 is made of any one of boron nitride, pyrolytic boron nitride, silicon nitride, CVD silicon nitride, aluminum nitride, and CVD aluminum nitride, or a combination of any two or more of those. Thereby, its insulating property is high and there is no scattering of impurities in use at a high temperature and the heating element can also be used in a heating process in which high purity is required.

In the conductive layer 3, the heater pattern 3a is formed on the plate portion 1a, and the current-carrying portion 3b is formed on the rod portion 1b, and the power-supply terminal 3c is formed on the end portion 1c, and the surfaces of the heater pattern 3a and the current-carrying part 3b are covered with the protection layer 4 and the conductive layer 3 is integrally formed. Therefore, the heating element is compact and is produced at a low cost, and additionally the conductive layer 3 is not assembled by combining a plurality of components and therefore is difficult to be delaminated, and the protection layer 4 becomes difficult to be cracked near a connecting part of the components by use and has a long-operation life. In addition, in the present invention, the corrosion-resistant layer 4p is formed on the protection layer 4, and therefore, a corrosive gas does not transmit inside and does not degrade the conductive layer.

Figure 3:
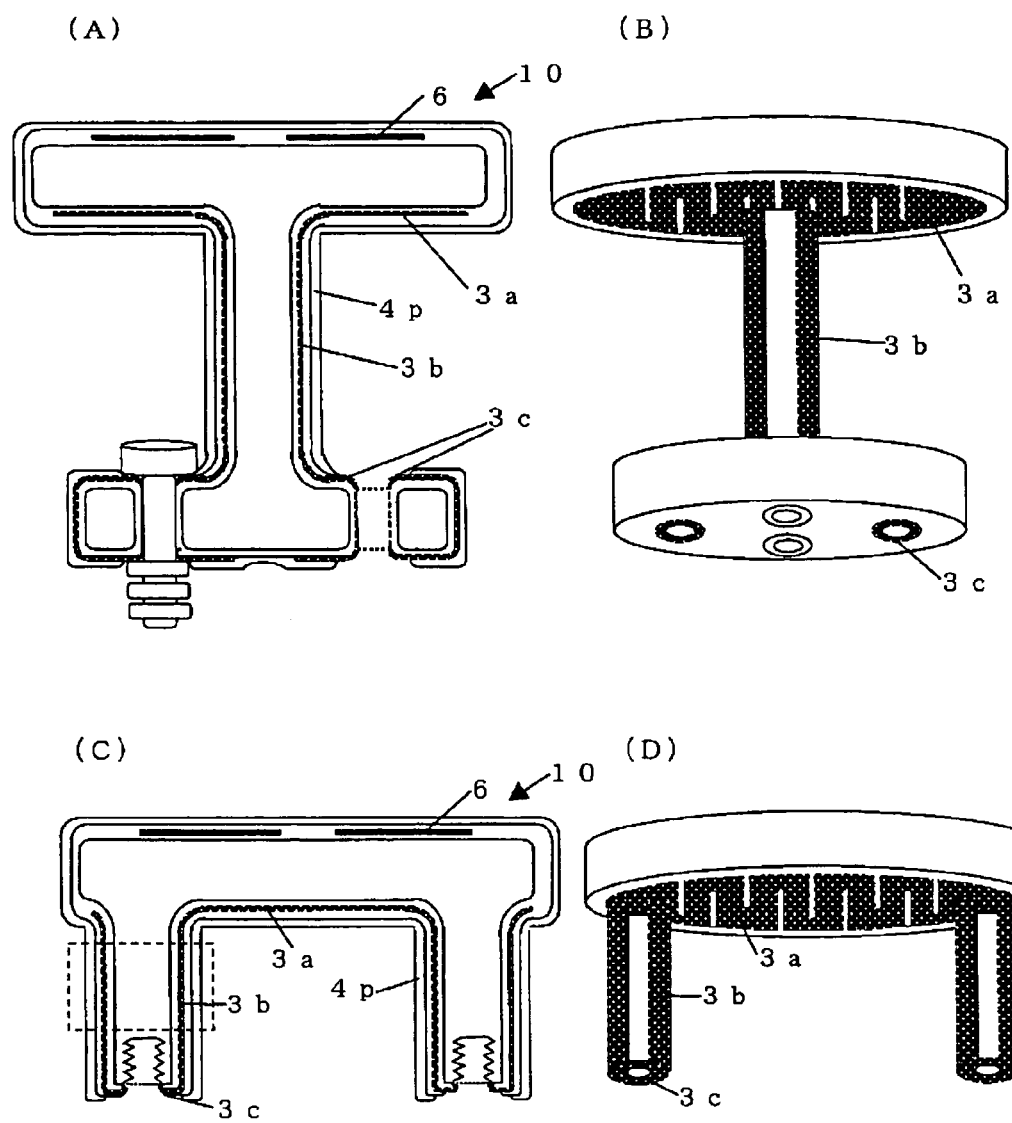
FIG. 3 is a schematic view of an example of the heating element according to the present invention in which the electrostatic chuck pattern is formed; (A)(C) Section views of the heating element; (B)(D) Perspective views from below of the heating element from which the corrosion-resistant layer and the protection layer are removed.

Furthermore, as shown in FIG. 3, it is preferable that the electrostatic chuck pattern 6 that is an electrode pattern supplying an electrostatic is provided and thereby an object to be heated becomes possible to be held. In particular, when the heater pattern 3a is formed on the surface of that side of the plate portion 1a from which the rod portion 1b projects as shown in FIG. 3(B)(D) and the electrostatic chuck pattern 6 for holding an object to be heated is formed on the surface in the opposite side of the plate portion 1a as shown in FIG. 3(A)(C), an object to be heated can be certainly held and heated and therefore, the heating position can be set high-precisely, and in such a case in which precision of the position of the object to be heated is required as ion implantation, plasma etching, sputtering, and so forth, a desired heating process can be performed more accurately. The pattern shape 6 of the electrostatic chuck can be, for example, comb-tooth shape, convolution shape, concentric circular shape, semicircular shape, lattice shape, wedgy shape, and so forth.

In the heating element 10 of the present invention as described above, a semiconductor wafer and such serving as the object to be heated are put on the heating portion 10a and the heating element 10 is electrically connected through the power terminal 5 and the heating is performed, and thereby, the corrosive gas is difficult to be transmitted even under an environment of a high temperature and a corrosive gas and therefore, degradation due to corrosion of a conductive layer, particularly, a power-supply-terminal portion can be avoided, and thereby it becomes possible that the heating element has a long operation life and is produced at a low cost.

In the case of using the heating element as an electrostatic chuck, its resistivity can be set to a desired value and the heating element can exert a high chuck capability.

Furthermore, when the heating portion 10a and the power-supply-terminal portion 10c are separated by the conductive portion 10b in which the current-carrying part 3b is formed on the rod portion 1b, the power-supply-terminal portion 10c comes to have a low temperature and becomes difficult to be worn away by a high-temperature gas in the process and comes to have a long operation life.

EXAMPLE

Hereinafter, the present invention will be explained more specifically with reference to Example and Comparative example. However, the present invention is not limited thereto.

Example 1

As shown in FIG. 1, there was prepared the single-piece heat-resistant base member 1 made of carbon in which from the center of one surface of the plate portion 1a having a thickness of 10 mm and an external diameter of 250 mm, the rod portion 1b having a diameter of 30 mm and a length of 100 mm was formed and the end portion 1c that was a small circular plate having a diameter of 60 mm and thickness of 10 mm in the opposite side of the rod portion 1b to the plate portion 1a and that four holes each having a diameter of 6 mm being capable of connecting to the power terminal 5 were formed was formed.

The heat-resistant base member 1 was placed in a thermal CVD furnace, and on the surface thereof, the dielectric layer 2 made of pyrolytic boron nitride having a thickness of 0.3 mm was formed by flowing the reactive gas whose volume mixture ratio of ammonium and boron trichloride was 4:1 and reacting them under the condition of 1900° C. and 1 Torr.

Next, the conductive layer 3 made of pyrolytic graphite having a thickness of 0.1 mm was formed by pyrolyzing a methane gas under the condition of 1800° C. and 3 Torr. Then, the conductive layer 3 was processed so that in the plate portion 1a the heater pattern 3a was formed on the heating surface side and so that the current-carrying part 3b was formed on the side surface thereof and on the back surface thereof and on the rod portion 1b and so that the power-supply terminal 3c was formed on the end portion 1c. In this case, the power-supply terminal 3c was set in two holes, and the other two holes were not used.

Then, the power-terminal portion 3c was masked, and the base member was placed in a thermal CVD furnace again. By flowing the reactive gas whose volume mixture ratio of ammonium and boron trichloride was 4:1 and reacting them under the condition of 1900° C. and 1 Torr, the protection layer 4 with an insulating property made of pyrolytic boron nitride having a thickness of 0.1 mm was formed on the surfaces of the heater pattern 3a and the current-carrying part 3b.

Furthermore, as the corrosion-resistant layer 4p, an aluminum nitride layer of 20 μm was formed thereon by reactive sputtering method, and thereby the heating element 10 was produced.

Moreover, the nitrogen gas permeability of a sample produced in the same manner was measured by using such a measurement apparatus 30 as shown in FIG. 5. First, a graphite plate 31 on which a layer 32 to be the same sample to be measured as the corrosion-resistant layer was formed was placed in such a measurement apparatus 30 being capable of vacuuming as shown in FIG. 5. Then a predetermined amount of nitrogen is introduced in a container 33 in the side of the graphite plate, and pressure change in a container 34 in the side of the sample was measured and thereby, the nitrogen gas permeability is measured. As shown in Table 1 as described above, the permeability was $1\times10^{-5}$ cm$^2$/sec, which was sufficiently small.

Furthermore, from the measurement of weight increase by film formation of the layer 32 to be a sample and the measurement of the void and the thickness by microscopic observation, the void ratio of the aluminum nitride layer was measured to be 2%, which was sufficiently small.

The heating element 10 produced as described above was electrically connected and heated in vacuo of $1\times10^{-4}$ Pa and the heating portion 10a could be heated to 300° C. with a power of 1.5 kw. In the case, the temperature of the power-supply-terminal portion 10c became 150° C., which could be drastically lower than that of the heating portion 10a.

CF$_4$ was introduced therein and the pressure was set to be $1\times10^{-2}$ Pa. However, for 200 hours, the heating could be performed without change. Thereby, it was confirmed that even under an environment of a high temperature and a corrosive gas, the corrosive gas is difficult to be transmitted and therefore, degradation due to corrosion of a conductive layer, particularly, a power-supply-terminal portion can be avoided.

Example 2

As shown in FIG. 2, there was formed the single-piece heat-resistant base member 1 made of carbon in which from two places of both ends of one surface of the plate portion 1a having a thickness of 10 mm and an external diameter of 250 mm, one pair of the rod portions 1b each having a diameter of 20 mm and a length of 50 mm was formed and the end portions 1c in which female screw holes of M10 having a depth of 10 mm were formed in the opposite side of the rod portion 1b to the plate portion 1a so as to be capable of performing electrical connection by screw was formed.

The heat-resistant base member 1 was placed in a thermal CVD furnace, and on the surface thereof, the dielectric layer 2 made of pyrolytic boron nitride having a thickness of 0.3 mm was formed by flowing the reactive gas whose volume mixture ratio of ammonium and boron trichloride was 4:1 and reacting them under the condition of 1900° C. and 1 Torr.

Next, the conductive layer 3 made of pyrolytic graphite having a thickness of 0.1 mm was formed by pyrolyzing a methane gas under the condition of 1800° C. and 3 Torr. Then, the conductive layer 3 was processed so that in the plate portion 1a, the heater pattern 3a was formed on the heating surface side and so that the power-supply terminal 3c was formed on the end portion 1c.

Then, the power-terminal portions 3c were masked, and the base member was placed in a thermal CVD furnace again. By flowing the reactive gas whose volume mixture ratio of ammonium and boron trichloride was 4:1 and reacting them under the condition of 1900° C. and 1 Torr, the protection layer 4 with an insulating property made of pyrolytic boron nitride having a thickness of 0.1 mm was formed on the surfaces of the heater pattern 3a and the current-carrying part 3b.

Furthermore, as the corrosion-resistant layer 4p, an yttria layer of 10 μm was formed thereon by plasma spaying method and then an yttria layer of 2 μm was formed by atmospheric thermal CVD method, and thereby the heating element 10 having two corrosion-resistant layers was produced.

Moreover, the nitrogen gas permeability of a sample in which those multiple yttria layers were produced in the same method as Example 1 was measured. As shown in Table 1 as described above, the permeability was $1\times10^{-4}$ cm$^2$/sec, which was sufficiently small.

Furthermore, in the same method as Example 1, the measurement of weight increase by formation of the layer to be a sample and the measurement of the void and the thickness by microscopic observation were performed, and thereby void ratio of the corrosion-resistant layer was obtained. As a result, as shown in the above-described Table 1, the void ratio of the yttria layer of 10 µm formed by plasma spraying method was measured to be 7%, and the void ratio of the yttria layer of 2 µm formed by atmospheric thermal CVD method was measured to be 2%. The void ratios were sufficiently small.

The heating element produced as described above was electrically connected and heated in vacuo of $1 \times 10^{-4}$ Pa and the heating portion could be heated to 400° C. with a power of 1.5 kw. In the case, the temperature of the power-supply-terminal portion 10c became 150° C., which could be drastically lower than that of the heating portion 10a.

$CF_4$ was introduced therein and the pressure was set to be $1 \times 10^{-2}$ Pa. However, for 200 hours, the wasting amount of the surface was 0.1 µm, which was very small. Thereby, it was confirmed that even under an environment of a high temperature and a corrosive gas, degradation due to corrosion of a conductive layer can be avoided.

Example 3

As the corrosion-resistant layer 4p, an yttria layer of 30 µm was formed by plasma splaying method by the same heating element 10 as Example 2.

Then, a nitrogen permeability and a void ratio of the corrosion-resistant layer were obtained in the same method as Example 2. Therefore, as shown in Table 1 as described above, they were $1 \times 10^{-2}$ cm$^2$/sec and 7%, respectively. The gas permeability was low and the void ratio was low. Furthermore, the heating examination and the $CF_4$ introduction examination were performed in the same method as Example 2, and almost the same result as Example 2 could be obtained, and it was confirmed that the heating element achieved an effect of the present invention.

Example 4

As shown in FIG. 1(D)(E), there was prepared the single-piece heat-resistant base member 1 made of carbon in which from the center of one surface of the plate portion 1a having a thickness of 10 mm and an external diameter of 250 mm, the rod portion 1b having a diameter of 30 mm and a length of 100 mm was formed and the end portion 1c that was a small circular plate having a diameter of 60 mm and thickness of 10 mm in the opposite side of the rod portion 1b to the plate portion 1a and that four holes each having a diameter of 6 mm being capable of connecting to the power terminal 5 were formed was formed.

The heat-resistant base member 1 was placed in a thermal CVD furnace, and on the surface thereof, the dielectric layer 2 made of pyrolytic boron nitride having a thickness of 0.3 mm was formed by flowing the reactive gas whose volume mixture ratio of ammonium and boron trichloride was 4:1 and reacting them under the condition of 1900° C. and 1 Torr.

Next, the conductive layer made of pyrolytic graphite having a thickness of 0.1 mm was formed on the both surfaces by pyrolyzing a methane gas under the condition of 1800° C. and 3 Torr. Then, as shown in FIG. 3(A)(B), the conductive layer was processed so that the heater pattern 3a was formed on the back side of the heating surface of the plate portion, and the current-carrying part 3b was formed on the rod portion and the power-supply terminal 3c was formed on the end portion.

Moreover, the electrostatic chuck pattern 6 was formed in the heating surface side of the plate portion by machining.

The power-terminal portion 3c was masked, and the base member was placed in a thermal CVD furnace again. By flowing the reactive gas whose volume mixture ratio of ammonium, boron trichloride, and propane was 4:1:0.4 and reacting them under the condition of 1900° C. and 1 Torr, the protection layer 4 with an insulating property made of pyrolytic boron nitride having a thickness of 0.1 mm was formed on the surfaces of the heater pattern 3a and the current-carrying part 3b. The resistivity of the protection layer 4 was measured at normal temperature and was found to be $1 \times 10^{12}$ Ω·cm.

Furthermore, the base member was set to an aluminum target, and an aluminum nitride layer of 20 µm containing the dopant of 5% carbon was formed as the corrosion-resistant layer 4p by reactive sputtering method in which an ammonium gas and an appropriate amount of methane gas are flowed.

The resistivity of this layer that was formed on a graphite plate under the same condition was measured at normal temperature and was found to be $1 \times 10^{13}$ Ω·cm. Its Vickers hardness was 7.5 GPa (Vickers measurement: HV1 (load 9.8N) JISR1610) and it could be confirmed that the resistivity was sufficiently low and also the hardness was sufficiently low.

The heating element produced as described above was electrically connected and heated in vacuo of $1 \times 10^{-4}$ Pa and the heating portion could be heated to 300° C. with a power of 1.5 kw. In the case, the temperature of the power-supply-terminal portion became 150° C., which could be drastically lower than that of the heating portion.

Moreover, a silicon wafer was placed on the heating element and a power voltage of 500 V was applied and therefore, the wafer could be favorably adsorbed. This was repeated at 10000 times. However, wearing in the chuck surface could be only slightly observed and also the silicon wafers were not damaged. Thereby, it was confirmed that the resistivity of the corrosion-resistant layer containing the dopant is low and also the hardness becomes low and thereby the heating element can exert a high chuck capability.

$CF_4$ was introduced therein and the pressure was set to be $1 \times 10^{-2}$ Pa. However, for 200 hours, the heating could be performed without change. Thereby, it was confirmed that even under an environment of a high temperature and a corrosive gas, degradation due to corrosion of a conductive layer, particularly, a power-supply-terminal portion can be avoided.

Example 5

As shown in FIG. 2(C)(D), there was formed the single-piece heat-resistant base member 1 made of carbon in which from two places of both ends of one surface of the plate portion 1a having a thickness of 10 mm and an external diameter of 250 mm, one pair of the rod portions 1b each having a diameter of 20 mm and a length of 50 mm was formed and the end portions 1c in which female screw holes of M10 having a depth of 10 mm were formed in the opposite side of the rod portion 1b to the plate portion 1a so as to be capable of performing electrical connection by screw was formed.

The heat-resistant base member 1 was placed in a thermal CVD furnace, and on the surface thereof, the dielectric layer 2 made of pyrolytic boron nitride having a thickness of 0.3 mm was formed by flowing the reactive gas whose volume mixture ratio of ammonium and boron trichloride was 4:1 and reacting them under the condition of 1900° C. and 1 Torr.

Next, the conductive layer made of pyrolytic graphite having a thickness of 0.1 mm was formed on the both surfaces by pyrolyzing a methane gas under the condition of 1800° C. and 3 Torr. Then as shown in FIG. 3(C)(D), the conductive layer was processed so that the heater pattern 3a was formed on the back side of the heating surface of the plate portion, and the current-carrying parts 3b were formed on the rod portion and the power-supply terminals 3c were formed on the end portion. Moreover, the electrostatic chuck pattern 6 was formed in the heating surface side of the plate portion by machining.

Then, the power-terminal portions 3c were masked, and the base member was placed in a thermal CVD furnace again. By flowing the reactive gas whose volume mixture ratio of ammonium, boron trichloride, and propane was 4:1:0.5 and reacting them under the condition of 1900° C. and 1 Torr, the protection layer 4 with an insulating property made of pyrolytic boron nitride having a thickness of 0.1 mm was formed on the surfaces of the heater pattern 3a and the current-carrying part 3b. The resistivity of the layer was measured at normal temperature and was found to be $1 \times 10^{11}$ Ω·cm.

By CVD method, an yttria layer of 100 nm containing boron that was the dopant was formed as the corrosion-resistant layer 4p by using a sublimed gas of an yttrium alkoxide compound and an yttrium complex. In order to make the layer contain boron, by flowing a 1/20 molar ratio of boron trichloride at the same time, the layer was set to a CVD yttria layer containing 5% boron in the layer.

The resistivity of this layer that was formed on a graphite plate under the same condition was measured at normal temperature and was found to be $1 \times 10^{12}$ Ω·cm. Its Vickers hardness was 6.5 GPa and it could be confirmed that the resistivity was sufficiently low and also the hardness was sufficiently low. Its surface was polished so that its surface roughness Ra became 0.5 μm, which was small.

The heating element produced as described above was electrically connected and heated in vacuo of $1 \times 10^{-4}$ Pa and the heating portion could be heated to 400° C. with a power of 1.5 kw. In the case, the temperature of the power-supply-terminal portion became 150° C., which could be drastically lower than that of the heating portion.

Moreover, a silicon wafer was placed on the heating element and a power voltage of 500 V was applied and therefore, the wafer could be favorably adsorbed. This was repeated at 10000 times. However, wearing in the chuck surface could be only slightly observed and also the silicon wafers were not damaged. Thereby, it was confirmed that the resistivity of the corrosion-resistant layer containing the dopant is low and also the hardness becomes low and thereby the heating element can exert a high chuck capability.

$CF_4$ was introduced therein and the pressure was set to be $1 \times 10^{-2}$ Pa. However, for 200 hours, the heating could be performed without change. Thereby, it was confirmed that even under an environment of a high temperature and a corrosive gas, degradation due to corrosion of a conductive layer can be avoided.

Comparative Example 1

Figure 4:
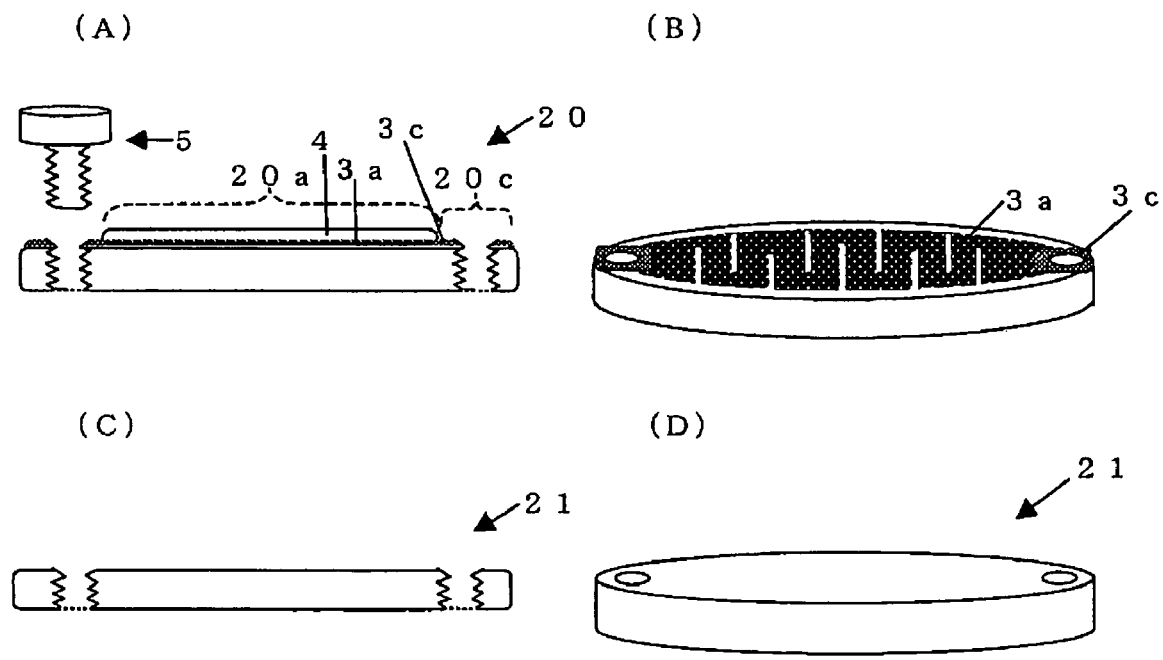
FIG. 4 is a schematic view of an example (Comparative example) of a conventional heating element; (A) A section view of the heating element; (B) A perspective view showing the entirety of a part in which a conductive layer is formed on a heat-resistant base member; (C) A section view of the heat-resistant base member; (D) A perspective view of the heat-resistant base member.

As shown in FIG. 4, there was formed the heat-resistant base member 21 made of carbon in which in both ends of one surface of the plate-shaped base member 21 having a thickness of 10 mm and an external diameter of 250 mm, female screw holes of M10 having a depth of 10 mm were formed so as to be capable of performing electrical connection by screw. The screw portion of M10 was preliminarily formed largely at 0.4 mm so that the electrical connection could be subsequently performed by screw.

The heat-resistant base member 21 was placed in a thermal CVD furnace, and on the surface thereof, the dielectric layer 2 made of pyrolytic boron nitride having a thickness of 0.3 mm was formed by flowing the reactive gas whose volume mixture ratio of ammonium and boron trichloride was 4:1 and reacting them under the condition of 1900° C. and 1 Torr.

Next, the conductive layer 3 made of pyrolytic graphite having a thickness of 0.1 mm was formed by pyrolyzing a methane gas under the condition of 1800° C. and 3 Torr. The conductive layer 3 was processed so that the heater pattern 3a was formed on the heating surface side of the base member was formed and so that the power-supply terminals 3c were formed on the both ends.

Then, the power-terminal portions 3c were masked, and the base member was placed in a thermal CVD furnace again. By flowing the reactive gas whose volume mixture ratio of ammonium and boron trichloride was 4:1 and the protection layer 4 with an insulating property made of pyrolytic boron nitride having a thickness of 0.1 mm was formed on the surfaces of the heater pattern 3a under the condition of 1900° C. and 1 Torr.

A uniform yttria layer having a thickness of 40 μm was formed as the corrosion-resistant layer by sol-gel method by applying an yttria-sol solution thereonto and then drying it and then calcining it. Thereby the heating element was accomplished.

Moreover, the nitrogen gas permeability was measured in the same method as Example 1 and was found to be $2 \times 10^{-2}$ $cm^2$/sec, which was a large result, as shown in Table 1 as described above.

Furthermore, in the same method as Example 1, the measurement of weight increase by film formation of the sample and the measurement of the void and the thickness by microscopic observation were performed, and therefore, the void ratio of the corrosion-resistant layer was measured to be 10% as shown in Table 1, which was a large result.

The heating element 20 in FIG. 4 produced as described above was electrically connected and heated in vacuo of $1 \times 10^{-4}$ Pa and the heating portion could be heated to 500° C. with a power of 1.5 kw. In this time, the temperature of the power-supply-terminal portion was 400° C., which could hardly be prevented from being heated.

Moreover, $CF_4$ was introduced therein with heating the temperature to 500° C. with a power of 1.0 kw. Therefore, in 50 hours, the yttria layer that was the layer of the outermost surface broke away and the boron nitride that was its ground fade away, and the conductive layer 3 such as the heater pattern 3a or current-carrying part 3b was cracked and broken.

Comparative Example 2

As shown in FIG. 4(C)(D), there was formed the heat-resistant base member 21 made of carbon in which in both ends of a surface of the plate-shaped base member 21 having a thickness of 10 mm and an external diameter of 250 mm, female screw holes of M10 having a depth of 10 mm were formed so as to be capable of performing electrical connection by screw. The screw portion of M10 was preliminarily formed largely at 0.4 mm so that the electrical connection could be subsequently performed by screw.

The heat-resistant base member 21 was placed in a thermal CVD furnace, and on the surface thereof, the dielectric layer 2 made of pyrolytic boron nitride having a thickness of 0.3 mm was formed by flowing the reactive gas whose volume mixture ratio of ammonium and boron trichloride was 4:1 and reacting them under the condition of 1900° C. and 1 Torr.

Next, the conductive layer made of pyrolytic graphite having a thickness of 0.1 mm was formed on the both surfaces by pyrolyzing a methane gas under the condition of 1800° C. and 3 Torr. Then, a heater pattern was formed on the back side of the heating surface of the plate portion, and an electrostatic chuck pattern was formed in the heating surface side of the plate portion by machining. The both ends of the heater pattern were processed so as to form power-supply terminals.

Then, the power-terminal portions 3c were masked, and the base member was placed in a thermal CVD furnace again. By flowing the reactive gas whose volume mixture ratio of ammonium and boron trichloride was 4:1 and reacting them under the condition of 1900° C. and 1 Torr, the protection layer 4 with an insulating property made of pyrolytic boron nitride having a thickness of 0.1 mm was formed on the surfaces of the heater pattern 3a.

A uniform yttria layer having a thickness of 10 μm and not containing the dopant was formed as the corrosion-resistant layer by sol-gel method by applying an yttria-sol solution thereonto and then drying it and then calcining it. Thereby, the heating element was accomplished.

The resistivity of this layer that was formed on a graphite plate under the same condition was measured at normal temperature and was found to be $1 \times 10^{14}$ Ω·cm or more. Its Vickers hardness was 11 GPa and it could be confirmed that the resistivity was high and also the hardness was large.

The heating element produced as described above was electrically connected and heated in vacuo of $1 \times 10^{-4}$ Pa and the heating portion could be heated to 500° C. with a power of 1.5 kw. In the case, the temperature of the power-supply-terminal portion was 400° C., which could hardly be prevented from being heated.

Moreover, a silicon wafer was placed on the heating element and a power voltage of 500 V was applied and therefore, displacement was occasionally caused due to shortage of the adsorbability. This was repeated at 10000 times. Therefore, wearing in the chuck surface was only slightly observed. However, the silicon wafers were drastically damaged.

The present invention is not limited to the above-described embodiments. The above-described embodiments are mere examples and those having the substantially same constitution as that described in the appended claims and providing the similar functions and advantages are included in the scope of the present invention.

For example, in the above-described Examples, the protection layer in which carbon or boron was contained as the dopant has been described. However, the present invention is not limited to the case, and also when titanium, germanium, or the like is contained, the same effect can be achieved.

What is claimed is:

1. A heating element comprising: at least
   a heat-resistant base member;
   a conductive layer having a heater pattern formed on the heat-resistant base member;
   a protection layer with an insulating property formed on the conductive layer; and
   a corrosion-resistant layer having a nitrogen gas permeability of $1 \times 10^{-2}$ cm$^2$/sec or less formed on the protection layer.

2. The heating element according to claim 1, wherein a void ratio of the corrosion-resistant layer is 7% or less.

3. The heating element according to claim 1, wherein the corrosion-resistant layer is made of any one of aluminum, yttrium, and silicon, or a compound of any one of those.

4. The heating element according to claim 2, wherein the corrosion-resistant layer is made of any one of aluminum, yttrium, and silicon, or a compound of any one of those.

5. The heating element according to claim 1, wherein the corrosion-resistant layer is made of any one of alumina, aluminum nitride, aluminum fluoride, yttria, yttrium nitride, yttrium fluoride, silicon oxide, and silicon nitride, or a combination of any two or more of those.

6. The heating element according to claim 2, wherein the corrosion-resistant layer is made of any one of alumina, aluminum nitride, aluminum fluoride, yttria, yttrium nitride, yttrium fluoride, silicon oxide, and silicon nitride, or a combination of any two or more of those.

7. A heating element comprising: at least
   a heat-resistant base member;
   a conductive layer having a heater pattern formed on the heat-resistant base member;
   a protection layer with an insulating property formed on the conductive layer; and
   a corrosion-resistant layer made of a compound containing a dopant formed on the protection layer.

8. The heating element according to claim 7, wherein on an opposite surface to a surface of the heat-resistant base member on which the heater pattern is formed, an electrostatic chuck pattern for holding an object to be heated is formed, and on the electrostatic chuck pattern, the protection layer and the corrosion-resistant layer are formed.

9. The heating element according to claim 7, wherein said compound constituting the corrosion-resistant layer is any one of alumina, aluminum nitride, yttria, and yttrium fluoride, or a combination of those.

10. The heating element according to claim 8, wherein said compound constituting the corrosion-resistant layer is any one of alumina, aluminum nitride, yttria, and yttrium fluoride, or a combination of those.

11. The heating element according to claim 7, wherein the dopant is any one of boron, aluminum, gallium, carbon, silicon, titanium, germanium, zirconium, yttrium, scandium, and lanthanoid elements, or a combination of any two or more of those.

12. The heating element according to claim 10, wherein the dopant is any one of boron, aluminum, gallium, carbon, silicon, titanium, germanium, zirconium, yttrium, scandium, and lanthanoid elements, or a combination of any two or more of those.

13. The heating element according to claim 7, wherein a content of the dopant is 0.01%~30%.

14. The heating element according to claim 12, wherein a content of the dopant is 0.01%~30%.

15. The heating element according to claim 7, wherein surface roughness Ra of an outermost surface of the corrosion-resistant layer is 1 μm or less.

16. The heating element according to claim 14, wherein surface roughness Ra of an outermost surface of the corrosion-resistant layer is 1 μm or less.

17. The heating element according to claim 7, wherein resistivity of an outermost surface of the corrosion-resistant layer is $10^8$~$10^{13}$ Ω·cm (room temperature).

18. The heating element according to claim 16, wherein resistivity of an outermost surface of the corrosion-resistant layer is $10^8$~$10^{13}$ Ω·cm (room temperature).

19. The heating element according to claim 7, wherein a Vickers hardness of an outermost surface of the corrosion-resistant layer is 1 GPa to 8 GPa.

20. The heating element according to claim 18, wherein a Vickers hardness of an outermost surface of the corrosion-resistant layer is 1 GPa to 8 GPa.

21. The heating element according to claim 1, wherein the corrosion-resistant layer is formed by any one of CVD method, reactive sputtering method, ion plating, spraying method, and sol-gel method, or a combined method of those.

22. The heating element according to claim 6, wherein the corrosion-resistant layer is formed by any one of CVD method, reactive sputtering method, ion plating, spraying method, and sol-gel method, or a combined method of those.

23. The heating element according to claim 7, wherein the corrosion-resistant layer is formed by any one of CVD method, reactive sputtering method, ion plating, spraying method, and sol-gel method, or a combined method of those.

24. The heating element according to claim 20, wherein the corrosion-resistant layer is formed by any one of CVD method, reactive sputtering method, ion plating, spraying method, and sol-gel method, or a combined method of those.

25. The heating element according to claim 1, wherein the corrosion-resistant layer is a layer having a thickness of 0.1 µm to 20 µm that is formed by any one of CVD method, reactive sputtering method, and ion plating.

26. The heating element according to claim 22, wherein the corrosion-resistant layer is a layer having a thickness of 0.1 µm to 20 µm that is formed by any one of CVD method, reactive sputtering method, and ion plating.

27. The heating element according to claim 7, wherein the corrosion-resistant layer is a layer having a thickness of 0.1 µm to 20 µm that is formed by any one of CVD method, reactive sputtering method, and ion plating.

28. The heating element according to claim 24, wherein the corrosion-resistant layer is a layer having a thickness of 0.1 µm to 20 µm that is formed by any one of CVD method, reactive sputtering method, and ion plating.

29. The heating element according to claim 1, wherein the corrosion-resistant layer is a layer having a thickness of 1 µm to 100 µm that is formed by spraying method or sol-gel method.

30. The heating element according to claim 22, wherein the corrosion-resistant layer is a layer having a thickness of 1 µm to 100 µm that is formed by spraying method or sol-gel method.

31. The heating element according to claim 7, wherein the corrosion-resistant layer is a layer having a thickness of 1 µm to 100 µm that is formed by spraying method or sol-gel method.

32. The heating element according to claim 24, wherein the corrosion-resistant layer is a layer having a thickness of 1 µm to 100 µm that is formed by spraying method or sol-gel method.

33. The heating element according to claim 1, wherein the protection layer is made of any one of boron nitride, pyrolytic boron nitride, silicon nitride, CVD silicon nitride, aluminum nitride, and CVD aluminum nitride, or a combination of any two or more of those.

34. The heating element according to claim 26, wherein the protection layer is made of any one of boron nitride, pyrolytic boron nitride, silicon nitride, CVD silicon nitride, aluminum nitride, and CVD aluminum nitride, or a combination of any two or more of those.

35. The heating element according to claim 7, wherein the protection layer is made of any one of boron nitride, pyrolytic boron nitride, silicon nitride, CVD silicon nitride, aluminum nitride, and CVD aluminum nitride, or a combination of any two or more of those.

36. The heating element according to claim 28, wherein the protection layer is made of any one of boron nitride, pyrolytic boron nitride, silicon nitride, CVD silicon nitride, aluminum nitride, and CVD aluminum nitride, or a combination of any two or more of those.

37. The heating element according to claim 1, wherein the conductive layer is made of pyrolytic carbon or grassy carbon.

38. The heating element according to claim 34, wherein the conductive layer is made of pyrolytic carbon or grassy carbon.

39. The heating element according to claim 7, wherein the conductive layer is made of pyrolytic carbon or grassy carbon.

40. The heating element according to claim 36, wherein the conductive layer is made of pyrolytic carbon or grassy carbon.

41. The heating element according to claim 1: wherein
the heat-resistant base member is a single piece comprising a plate portion on which a heater pattern is formed, a rod portion which projects from one surface of the plate portion and on which the current-carrying part is formed, an end portion which is located in an opposite end of the rod portion to the plate portion and on which a power-supply terminal is formed;
a dielectric layer with an insulating property is formed on a surface of the heat-resistant base member;
the conductive layer is formed on the dielectric layer; and
the protection layer is integrally formed so as to cover surfaces of the heater pattern and the current-carrying part.

42. The heating element according to claim 38: wherein
the heat-resistant base member is a single piece comprising a plate portion on which a heater pattern is formed, a rod portion which projects from one surface of the plate portion and on which the current-carrying part is formed, an end portion which is located in an opposite end of the rod portion to the plate portion and on which a power-supply terminal is formed;
a dielectric layer with an insulating property is formed on a surface of the heat-resistant base member;
the conductive layer is formed on the dielectric layer; and
the protection layer is integrally formed so as to cover surfaces of the heater pattern and the current-carrying part.

43. The heating element according to claim 7: wherein
the heat-resistant base member is a single piece comprising a plate portion on which a heater pattern is formed, a rod portion which projects from one surface of the plate portion and on which the current-carrying part is formed, an end portion which is located in an opposite end of the rod portion to the plate portion and on which a power-supply terminal is formed;
a dielectric layer with an insulating property is formed on a surface of the heat-resistant base member;
the conductive layer is formed on the dielectric layer; and
the protection layer is integrally formed so as to cover surfaces of the heater pattern and the current-carrying part.

44. The heating element according to claim 40: wherein
the heat-resistant base member is a single piece comprising a plate portion on which a heater pattern is formed, a rod portion which projects from one surface of the plate portion and on which the current-carrying part is formed, an end portion which is located in an opposite end of the rod portion to the plate portion and on which a power-supply terminal is formed;
a dielectric layer with an insulating property is formed on a surface of the heat-resistant base member;
the conductive layer is formed on the dielectric layer; and the protection layer is integrally formed so as to cover surfaces of the heater pattern and the current-carrying part.

45. The heating element according to claim 41, wherein the heat-resistant base member is made of graphite.

46. The heating element according to claim 42, wherein the heat-resistant base member is made of graphite.

47. The heating element according to claim 43, wherein the heat-resistant base member is made of graphite.

48. The heating element according to claim 44, wherein the heat-resistant base member is made of graphite.

49. The heating element according to claim 41, wherein the dielectric layer is made of any one of boron nitride, pyrolytic boron nitride, silicon nitride, CVD silicon nitride, aluminum nitride, and CVD aluminum nitride, or a combination of any two or more of those.

50. The heating element according to claim 43, wherein the dielectric layer is made of any one of boron nitride, pyrolytic boron nitride, silicon nitride, CVD silicon nitride, aluminum nitride, and CVD aluminum nitride, or a combination of any two or more of those.

51. The heating element according to claim 46, wherein the dielectric layer is made of any one of boron nitride, pyrolytic boron nitride, silicon nitride, CVD silicon nitride, aluminum nitride, and CVD aluminum nitride, or a combination of any two or more of those.

52. The heating element according to claim 48, wherein the dielectric layer is made of any one of boron nitride, pyrolytic boron nitride, silicon nitride, CVD silicon nitride, aluminum nitride, and CVD aluminum nitride, or a combination of any two or more of those.

53. The heating element according to claim 41, wherein a length of the rod portion is 10~200 mm.

54. The heating element according to claim 43, wherein a length of the rod portion is 10~200 mm.

55. The heating element according to claim 51, wherein a length of the rod portion is 10~200 mm.

56. The heating element according to claim 52, wherein a length of the rod portion is 10~200 mm.

57. The heating element according to claim 41, wherein the heater pattern is formed on the surface of that side of the plate portion from which the rod portion projects, and the electrostatic chuck pattern for holding an object to be heated is formed on the surface in the opposite side of the plate portion.

58. The heating element according to claim 43, wherein the heater pattern is formed on the surface of that side of the plate portion from which the rod portion projects, and the electrostatic chuck pattern for holding an object to be heated is formed on the surface in the opposite side of the plate portion.

59. The heating element according to claim 55, wherein the heater pattern is formed on the surface of that side of the plate portion from which the rod portion projects, and the electrostatic chuck pattern for holding an object to be heated is formed on the surface in the opposite side of the plate portion.

60. The heating element according to claim 56, wherein the heater pattern is formed on the surface of that side of the plate portion from which the rod portion projects, and the electrostatic chuck pattern for holding an object to be heated is formed on the surface in the opposite side of the plate portion.

\* \* \* \* \*